United States Patent
Hsu

(10) Patent No.: US 10,868,467 B1
(45) Date of Patent: Dec. 15, 2020

(54) PUMP CIRCUIT, PUMP DEVICE, AND OPERATION METHOD OF PUMP CIRCUIT

(71) Applicant: NANYA TECHNOLOGY CORPORATION, New Taipei (TW)

(72) Inventor: Ting-Shuo Hsu, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/578,388

(22) Filed: Sep. 22, 2019

(51) Int. Cl.
*H02M 3/07* (2006.01)
*G11C 11/4074* (2006.01)

(52) U.S. Cl.
CPC ........... *H02M 3/07* (2013.01); *G11C 11/4074* (2013.01)

(58) Field of Classification Search
None
See application file for complete search history.

(56) References Cited

U.S. PATENT DOCUMENTS

| | | | | |
|---|---|---|---|---|
| 6,608,511 B1* | 8/2003 | Hsu | ........................ | H03L 7/087 327/157 |
| 6,642,774 B1* | 11/2003 | Li | ........................ | H02M 3/073 327/536 |
| 7,397,298 B2* | 7/2008 | Tsukude | .................. | G05F 1/465 327/535 |
| 8,169,253 B2* | 5/2012 | Umezawa | .............. | G11C 5/145 327/534 |
| 2008/0054991 A1* | 3/2008 | Maejima | ................. | H02M 3/07 327/536 |
| 2009/0108888 A1* | 4/2009 | Gebara | ................... | H02M 3/07 327/148 |
| 2014/0084936 A1* | 3/2014 | Pan | ...................... | G11C 29/025 324/509 |

* cited by examiner

*Primary Examiner* — Lincoln D Donovan
*Assistant Examiner* — Khareem E Almo
(74) *Attorney, Agent, or Firm* — CKC & Partners Co., LLC

(57) ABSTRACT

A pump circuit is disclosed. The pump circuit includes a first pump core circuit and a second pump core circuit. The second pump core circuit is coupled to the first pump core circuit. When a voltage value of a power source input to the pump circuit is not lower than a threshold voltage value, the first pump core circuit is operated and the second pump core circuit is not operated. When the voltage value of the power source is lower than the threshold voltage value, the first pump core circuit and the second pump core circuit are operated, so that a current value of the output current transmitted by the pump circuit is not lower than a threshold current value.

7 Claims, 4 Drawing Sheets

PUMP CIRCUIT, PUMP DEVICE, AND OPERATION METHOD OF PUMP CIRCUIT

FIELD OF INVENTION

The invention relates to a pump circuit, a pump device, and an operation method of the pump circuit. More particularly, the invention relates to a pump circuit, a pump device, and an operation method of the pump circuit for controlling an output current of the pump circuit.

BACKGROUND

Nowadays, the supply voltages of the devices become lower. For example, the supply voltage of the new product such as DDR5 SDRAM (double data rate fifth-generation synchronous dynamic random-access memory) is lower than the Double-Data-Rate Fourth Generation Synchronous Dynamic Random Access Memory DDR4 SDRAM. However, when the supply voltage is lower, the current value of the output current output by the pump circuit becomes smaller as well, which causes operation errors.

SUMMARY

An embodiment of this disclosure is to provide a pump circuit is disclosed. The pump circuit includes a first pump core circuit and a second pump core circuit. The second pump core circuit is coupled to the first pump core circuit. When a voltage value of a power source input to the pump circuit is not lower than a threshold voltage value, the first pump core circuit is operated and the second pump core circuit is not operated. When the voltage value of the power source is lower than the threshold voltage value, the first pump core circuit and the second pump core circuit are operated, so that a current value of the output current transmitted by the pump circuit is not lower than a threshold current value.

Another embodiment of this disclosure is to provide a pump device. The pump device includes a sense circuit and a pump circuit. The pump circuit is coupled to the sense circuit. The pump circuit includes a first pump core circuit and a second pump core circuit. The second pump core circuit is coupled to the first pump core circuit. The pump circuit is enabled according to a control signal output from the sense circuit. When a voltage value of a first power source input to the pump circuit is not lower than a threshold voltage value, the first pump core circuit is operated and the second pump core circuit is not operated. When the voltage value of the first power source is lower than the threshold voltage value, the first pump core circuit and the second pump core circuit are operated, so that a current value of the output current transmitted by the pump circuit is not lower than a threshold current value.

Another embodiment of this disclosure is to provide an operation method of a pump circuit. The pump circuit comprises a first pump core circuit and a second pump core circuit. The operation method includes the following operations: enabling the first pump core circuit and the second pump core circuit when a voltage value of a power source input to the pump circuit is lower than a threshold voltage value, so that a current value of the output current transmitted by the pump circuit is not lower than a threshold current value; and enabling the first pump core circuit and disabling the second pump core circuit when the voltage value of the power source input to the pump circuit is not lower than the threshold voltage value.

The embodiment of the present disclosure is to provide a pump circuit, a pump device, and an operation method of the pump circuit, by enabling more than one pump core circuit when the power source input to the pump circuit becomes smaller, so as to maintain the output current.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
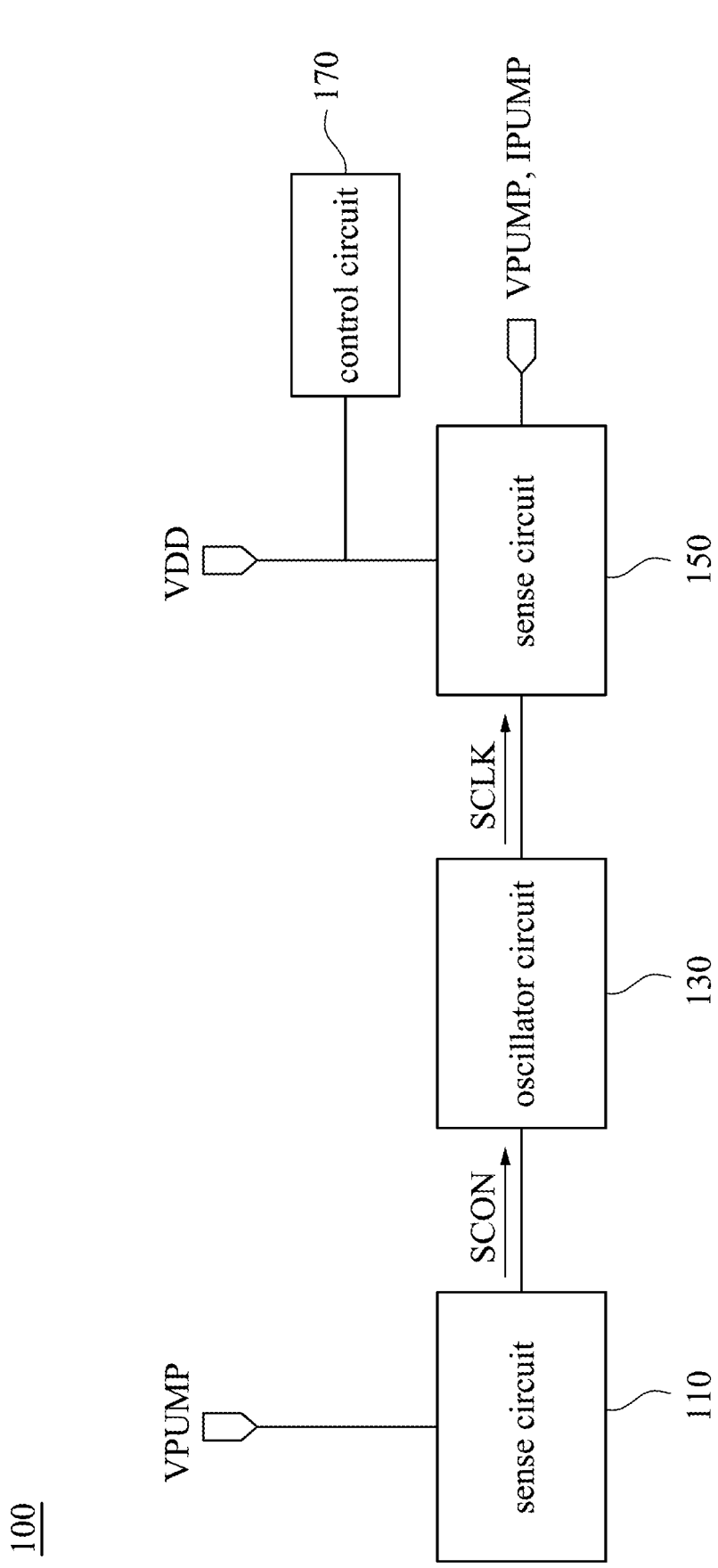
FIG. 1 is a schematic diagram illustrating a pump device according to some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention.

Reference is made to FIG. 1. FIG. 1 is a schematic diagram illustrating a pump device 100 according to some embodiments of the present disclosure. As illustrated in FIG. 1, the pump device 100 includes a sense circuit 110, an oscillator circuit 130, and a pump circuit 150. In the connection relationship, the sense circuit 110 is coupled to the oscillator circuit 130, and the oscillator circuit 130 is coupled to the pump circuit 150. The pump device 100 shown in FIG. 1 is for illustrative purposes only and the present disclosure is not limited thereto.

Figure 2:
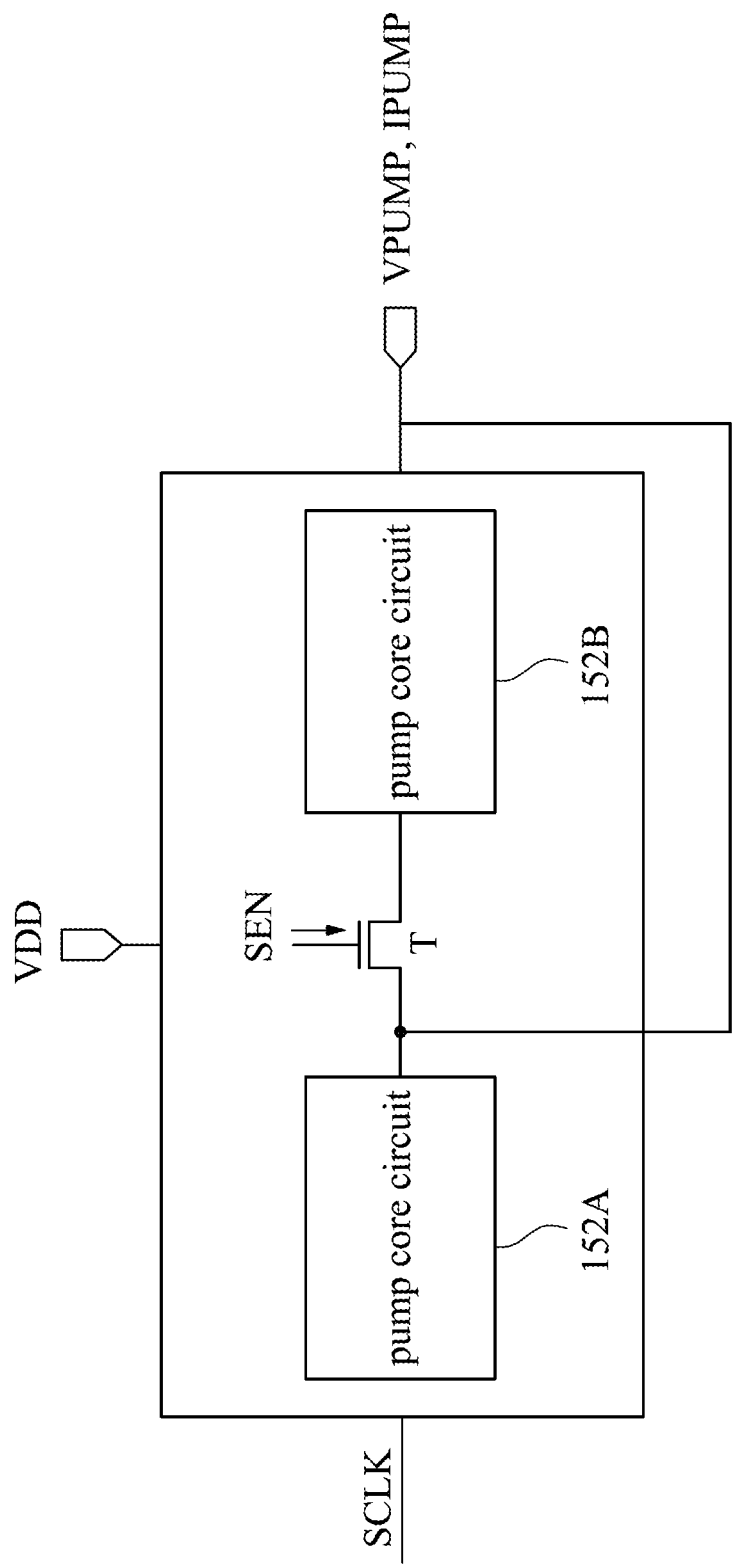
FIG. 2 is a schematic diagram illustrating a pump circuit according to some embodiments of the present disclosure.

Reference is made to FIG. 2. FIG. 2 is a schematic diagram illustrating a pump circuit 150 according to some embodiments of the present disclosure. As illustrated in FIG. 2, the pump circuit 150 includes pump core circuits 152A, 152B. In the connection relationship, the pump core circuit 152A is coupled to the pump core circuit 152B. In some embodiments, the pump circuit 150 further comprises a switch T. In the connection relationship, the switch T is coupled to the pump core circuits 152A and the 152B.

Figure 3:
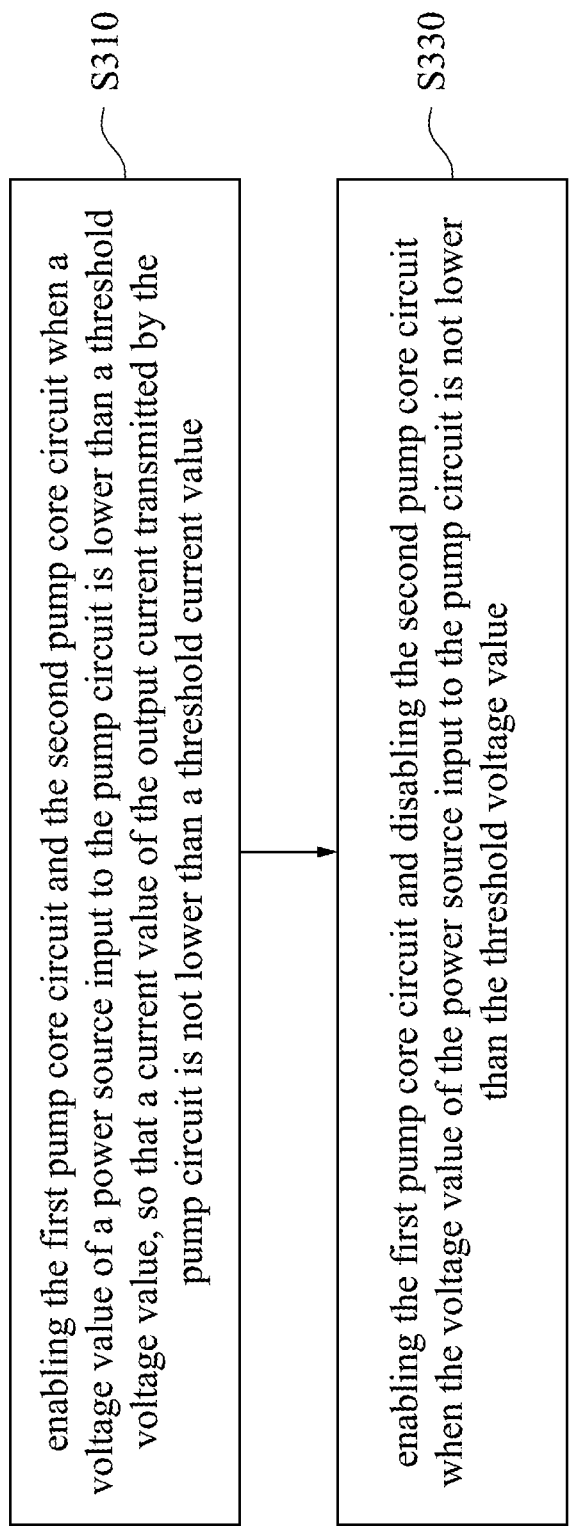
FIG. 3 is a flowchart illustrating the operating method in accordance with some embodiments of the present disclosure.

Reference is made to FIG. 3. For better understanding of the present disclosure, the detailed operation of the pump device 100 will be discussed in accompanying with the embodiments shown in FIG. 3. FIG. 3 is a flowchart illustrating the operating method 300 in accordance with some embodiments of the present disclosure. It should be noted that the operating method 300 can be applied to the pump device 100 having a structure that is the same as or similar to the structure of the pump device 100 shown in FIG. 1. To simplify the description below, the embodiments shown in FIG. 1 will be used as an example to describe the operating method 300 according to some embodiments of the present disclosure. However, the present disclosure is not limited to application to the embodiments shown in FIG. 1. As shown in FIG. 3, the operating method 300 includes operations S310 to S330.

In operation S310, enabling the first pump core circuit and the second pump core circuit when a voltage value of a power source input to the pump circuit is lower than a threshold voltage value, so that a current value of the output current transmitted by the pump circuit is not lower than a threshold current value.

For details of operation S310, reference is made to FIG. 1 and FIG. 2 at the same time. The pump circuit 150 receives a power source VDD. When the voltage value of the power source VDD is lower than a threshold voltage value, both of the pump core circuits 152A, 152B are enabled and operated, so that the current value of the output current IPUMP transmitted by the pump circuit 150 is not lower than the threshold current value.

In some embodiments, when the voltage value of the power source VDD input to the pump circuit 150 is lower than the threshold voltage value, the switch T as illustrated in FIG. 2 is conducted so that the pump core circuit 152B is operated. When both of the pump core circuits 152A, 152B are enabled and operated, the output current IPUMP transmitted by the pump circuit 150 includes the output current of the pump core circuit 152A and the output current of the pump core circuit 152B. Therefore, the output current IPUMP becomes higher than the situation of only one of the pump core circuits 152A, 152B is operated.

In operation S330, enabling the first pump core circuit and disabling the second pump core circuit when the voltage value of the power source input to the pump circuit is not lower than the threshold voltage value.

For details of operation S330, reference is made to FIG. 1 and FIG. 2 at the same time. When the voltage value of the power source VDD is not lower than a threshold voltage value, the pump core circuit 152A is enabled and operated, and the pump core circuit 152B is not enabled and operated.

In some embodiments, when the voltage value of the power source VDD input to the pump circuit 150 is not lower than the threshold voltage value, the switch T as illustrated in FIG. 2 is not conducted so that the pump core circuit 152B is not operated. When only the pump core circuit 152A is enabled and operated, the output current IPUMP transmitted by the pump circuit 150 includes only the output current of the pump core circuit 152A. However, since the voltage value of the power source VDD input to the pump circuit 150 is not lower than the threshold voltage value, the output current IPUMP is still higher than the threshold current value.

Figure 4:
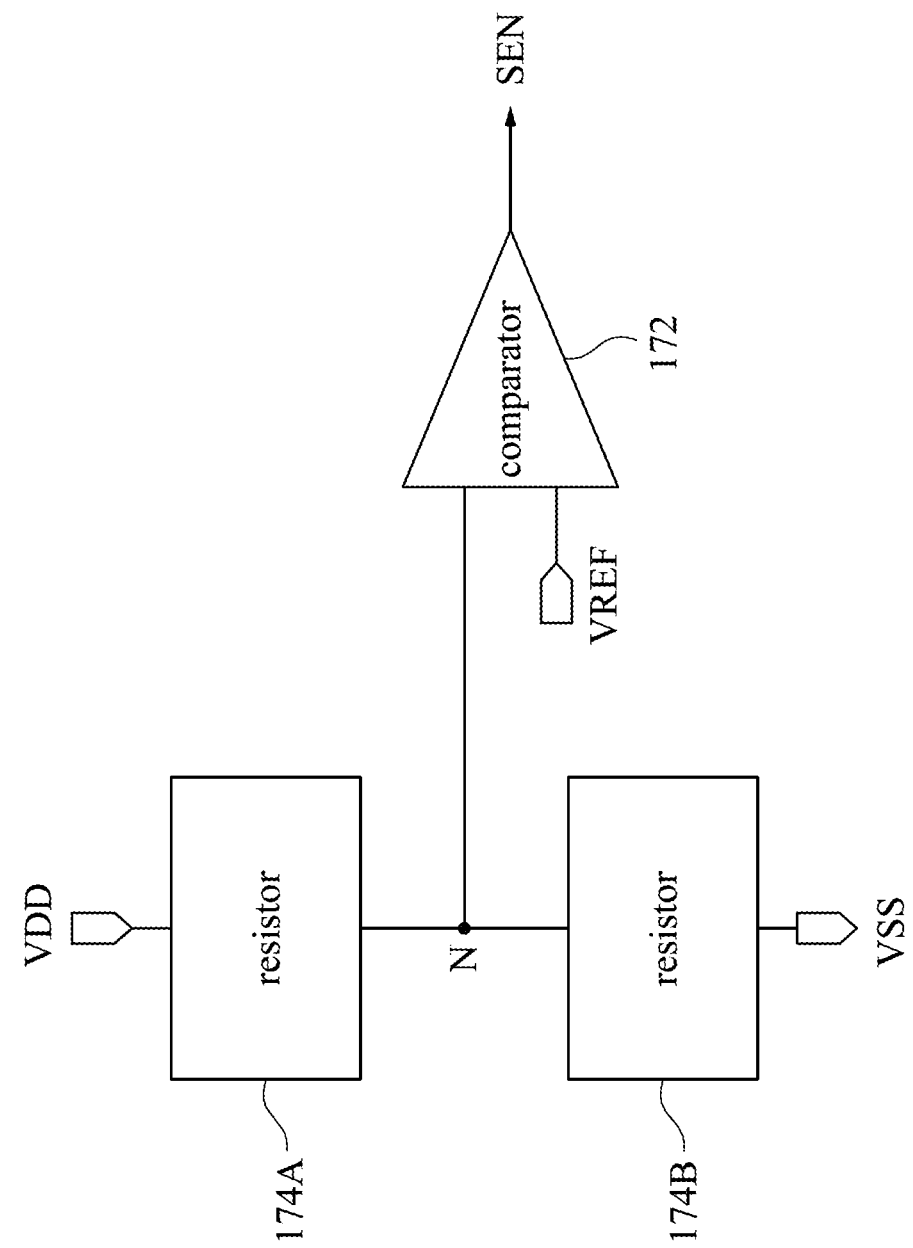
FIG. 4 is a schematic diagram illustrating a control circuit according to some embodiments of the present disclosure.

As illustrated in FIG. 1, in some embodiments, the pump device 100 further includes a control circuit 170. Reference is made to FIG. 4. FIG. 4 is a schematic diagram illustrating a control circuit 170 as illustrated in FIG. 1 according to some embodiments of the present disclosure. As illustrated in FIG. 4, the control circuit 170 includes resistors 174A, 174B, and a comparator 172. In the connection relationship, a first end of the resistor 174A is coupled to the power source VDD, a second end of the resistor 174A is coupled to the node N. A first end of the resistor 174B is coupled to the node N, and a second end of the resistor 174B is coupled to the power source VSS. A first end of the comparator 172 is coupled to the node N, a second end of the comparator 172 receives a reference voltage VREF, and an output end of the comparator 172 is coupled to the switch T as illustrated in FIG. 2.

In some embodiments, the control circuit 170 outputs an enable signal SEN to the switch T so as to conduct the switch T when the voltage value of the power source VDD is lower than the threshold voltage value.

In detail, in some embodiments, the comparator 172 compares the voltage value of the node N and the voltage value of the reference voltage VREF. When the voltage value of the node N is smaller than the voltage value of the reference voltage VREF, the comparator 172 outputs the enable signal SEN to the control terminal of the switch T as illustrated in FIG. 2, so as to conduct the switch T.

In some embodiments, when the voltage value of the node N is smaller than the voltage value of the reference voltage VREF, the comparator 172 outputs the enable signal SEN with a high voltage value to the control end of the switch T so as to conduct the switch T. On the other hand, when the voltage value of the node N is not smaller than the voltage value of the reference voltage VREF, the comparator 172 outputs the enable signal SEN with a low voltage value to the control end of the switch T so as not to conduct the switch T.

Reference is made to FIG. 1 again. In some embodiments, the sense circuit 110 is configured so sense the voltage value of the output voltage VPUMP transmitted from the pump circuit 150. When the voltage value of the output voltage VPUMP is lower than a threshold voltage value, the sense circuit 110 outputs a control signal SCON to the oscillator circuit 130. The oscillator circuit 130 outputs a clock signal SCLK to the pump circuit 150 according to the control signal SCON, so as to enable and operate the pump circuit 150. When the pump circuit 150 is enabled, the pump circuit 150 is operated as the operation method 300 in FIG. 3.

In some embodiments, the pump device 100 may be part of the dynamic random access memory (DRAM) or any other circuits with the function of data storing and/or data reading or other similar functions, but the embodiments of the present disclosure is not limited thereto. In some embodiments, the pump device 100 may be a charge pump device or any other circuits with the function of increasing the voltage value.

On the implementation, the switch T as illustrated in FIG. 2 may be realized by a P-type low temperature polysilicon film transistor, however, the embodiments of the present disclosure is not limited thereto. For example, the switch T may also be realized by the P-type amorphous silicon film transistor. In some embodiments, it may also be implemented using an N-type thin film transistor, and the embodiments of the present disclosure is not limited thereto.

The pump circuit 150 as illustrated in FIG. 2 includes two pump core circuits 152A, 152B. However, the embodiments of the present disclosure are not limited thereto. That is, in some embodiments, the pump circuit 150 may include three or more pump core circuits.

According to the embodiment of the present disclosure, it is understood that the embodiment of the present disclosure is to provide a pump circuit, a pump device, and an operation method of the pump circuit, by enabling more than one pump core circuit when the power source input to the pump circuit becomes smaller, so as to maintain the output current.

In this document, the term "coupled" may also be termed as "electrically coupled", and the term "connected" may be termed as "electrically connected". "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pump circuit, comprising:
   a first pump core circuit;
   a second pump core circuit, coupled to the first pump core circuit;
   a switch, coupled to the first pump core circuit and the second pump core circuit; and
   a control circuit;
   wherein when a voltage value of a first power source input to the pump circuit is not lower than a threshold voltage value, the first pump core circuit is operated and the second pump core circuit is not operated;
   wherein when the voltage value of the first power source is lower than the threshold voltage value, the first pump core circuit and the second pump core circuit are operated, so that a current value of an output current transmitted by the pump circuit is not lower than a threshold current value;
   wherein when the voltage value of the first power source input to the pump circuit is lower than the threshold voltage value, the switch is conducted so that the second pump core circuit is operated;
   wherein the control circuit is configured to output an enable signal so to conduct the switch when the voltage value of the first power source is lower than the threshold voltage value;
   wherein the control circuit comprises:
   a first resistor, wherein a first end of the first resistor is coupled to the first power source, and a second end of the first resistor is coupled to a node;
   a second resistor, wherein a first end of the second resistor is coupled to the node, and a second end of the second resistor is coupled to a second power source; and
   a comparator, wherein a first end of the comparator is coupled to the node, a second end of the comparator receives a reference voltage, and a output end of the comparator is coupled to the switch.

2. A pump device, comprising:
   a sense circuit; and
   a pump circuit, coupled to the sense circuit, wherein the pump circuit comprises:
   a first pump core circuit; and
   a second pump core circuit, coupled to the first pump core circuit;
   a switch, coupled to the first pump core circuit and the second pump core circuit; and
   a control circuit;
   wherein the pump circuit is enabled according to a control signal output from the sense circuit;
   wherein when a voltage value of a first power source input to the pump circuit is not lower than a threshold voltage value, the first pump core circuit is operated and the second pump core circuit is not operated;
   wherein when the voltage value of the first power source is lower than the threshold voltage value, the first pump core circuit and the second pump core circuit are operated, so that a current value of an output current transmitted by the pump circuit is not lower than a threshold current value;
   wherein when the voltage value of the first power source input to the pump circuit is lower than the threshold voltage value, the switch is conducted so that the second pump core circuit is operated;
   wherein the control circuit is configured to output an enable signal so to conduct the switch when the voltage value of the first power source is lower than the threshold voltage value;
   wherein the control circuit comprises:
   a first resistor, wherein a first end of the first resistor is coupled to the first power source, and a second end of the first resistor is coupled to a node;
   a second resistor, wherein a first end of the second resistor is coupled to the node, and a second end of the second resistor is coupled to a second power source; and
   a comparator, wherein a first end of the comparator is coupled to the node, a second end of the comparator receives a reference voltage, and a output end of the comparator is coupled to the switch.

3. The pump device of claim 2, wherein the sense circuit is further configured to sense a voltage value of an output voltage transmitted from the pump circuit, wherein when the voltage value of the output voltage is lower than a threshold voltage value, the sense circuit outputs the control signal.

4. The pump device of claim 2, further comprising:
   an oscillator circuit, coupled to the sense circuit and the pump circuit, wherein the pump device is configured to output a clock signal to the pump circuit according to the control signal, so as to enable the pump circuit.

5. The pump device of claim 2, wherein the comparator is configured to compare a voltage value of the node and a voltage value of the reference voltage, and when the voltage value of the node is smaller than the voltage value of the reference voltage, the comparator outputs the enable signal.

6. The pump device of claim 5, wherein the comparator outputs the enable signal to a control terminal of the switch so as to conduct the switch.

7. An operation method of a pump circuit, wherein the pump circuit comprises a first pump core circuit and a second pump core circuit, wherein the operation method comprises:
- enabling the first pump core circuit and the second pump core circuit when a voltage value of a first power source input to the pump circuit is lower than a threshold voltage value, so that a current value of an output current transmitted by the pump circuit is not lower than a threshold current value;
- conducting a switch between the first pump core circuit and the second pump core circuit when the voltage value of the first power source is lower than the threshold voltage value, so as to enable the second pump core circuit;
- outputting an enable signal by a control circuit so to conduct the switch when the voltage value of the first power source is lower than the threshold voltage value; and
- enabling the first pump core circuit and disabling the second pump core circuit when the voltage value of the first power source input to the pump circuit is not lower than the threshold voltage value;

wherein the control circuit comprises:
- a first resistor, wherein a first end of the first resistor is coupled to the first power source, and a second end of the first resistor is coupled to a node;
- a second resistor, wherein a first end of the second resistor is coupled to the node, and a second end of the second resistor is coupled to a second power source; and
- a comparator, wherein a first end of the comparator is coupled to the node, a second end of the comparator receives a reference voltage, and a output end of the comparator is coupled to the switch.

* * * * *